(12) United States Patent
Ruigrok

(10) Patent No.: US 6,278,588 B1
(45) Date of Patent: Aug. 21, 2001

(54) MAGNETORESISTIVE MAGNETIC FIELD SENSOR

(75) Inventor: Jacobus J. M. Ruigrok, Eindhoven (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/431,579

(22) Filed: Nov. 1, 1999

(30) Foreign Application Priority Data

Oct. 30, 1998 (EP) .................................................. 98203680

(51) Int. Cl.$^7$ ........................................................ G11B 5/39
(52) U.S. Cl. .............................................................. 360/313
(58) Field of Search ................................. 360/324, 324.2, 360/325, 326, 327, 327.33, 313, 324.1, 324.11, 324.12, 327.1, 327.11, 327.2, 327.21, 327.22, 327.23, 327.24, 327.3, 327.31, 327.32

(56) References Cited

U.S. PATENT DOCUMENTS

| | | | |
|---|---|---|---|
| 4,047,236 | * 9/1977 | Lee ........................................ | 360/313 |
| 4,438,470 | * 3/1984 | Sawada et al. ....................... | 360/322 |
| 4,477,794 | * 10/1984 | Nomura et al. ...................... | 428/611 |
| 5,589,278 | * 12/1996 | Kamijo ................................ | 338/32 R |

* cited by examiner

*Primary Examiner*—David L. Ometz
*Assistant Examiner*—Franklin D. Altman, III
(74) *Attorney, Agent, or Firm*—David R. Treacy

(57) ABSTRACT

A magnetoresistive magnetic field sensor comprises a bilayer with a first soft magnetic layer and in direct contact therewith a second soft magnetic layer. The layers are exchange coupled to one another. The second soft magnetic layer is located below, on or in the first soft magnetic layer in a meandering, spiraling or suchlike structure. The electrical resistivity of the first soft magnetic layer is higher than that of the second soft magnetic layer, while the difference in electrical resistivity between both soft magnetic layers is at least a factor of 10, preferably a factor of 100. The magnetoresistive magnetic field sensor is applied in a magnetic read head device for a recording information system.

9 Claims, 2 Drawing Sheets

MAGNETORESISTIVE MAGNETIC FIELD SENSOR

BACKGROUND OF THE INVENTION

The invention relates to a magnetoresistive magnetic field sensor comprising a bilayer with a first soft magnetic layer and in direct contact therewith a second soft magnetic layer, said layers being exchange coupled to one another, the electrical resistivity of the first soft magnetic layer being higher than that of the second soft magnetic layer.

In such a magnetoresistive magnetic field sensor it is of advantage to obtain a magnetoresistance ratio (MR-value) which, also with a relatively small external magnetic field, is sufficient to perform an accurate measurement of the change in the resistivity due to a rotation of the magnetization vector in the bilayer by the external magnetic field. This magnetoresistance ratio is deducted from the resistance value of the sensor in both the absence ($R_o$) and the presence ($R_s$) of an external magnetic field:

$$MR = \frac{|R_o - R_s|}{R_s}$$

From Kamiguchi et al; Giant magnetoresistance and soft magnetic properties of $Co_{90}Fe_{10}$/Cu spin-valve structures, J. Appl. Phys. 79 (8), Apr. 15, 1996, it is known to deposite a NiFe/CoFe layer on a soft magnetic layer, e.g. a CoNbZr layer. In such a bilayer structure with a NiFe/CoFe layer deposited on a CoNbZr layer, the NiFe/CoFe layer has a relatively low electrical resistivity, while the CoNbZr layer has an electrical resistivity which is about a factor of 4 larger than that of the NiFe/CoFe layer. Although the NiFe/CoFe material demonstrates a relatively large anisotropic magnetoresistance effect, the relatively low electrical resistivity of these materials forms a limiting factor in the measurement thereof.

SUMMARY OF THE INVENTION

The object of the invention is to increase the sensitivity of the measurement of the magnetoresistance ratio and to obtain a more accurate magnetoresistive magnetic field sensor.

This object is achieved with the magnetoresistive magnetic field sensor according to the invention, which is characterized in that the second soft magnetic layer is located below, on or in the first soft magnetic layer in a meandering, spiraling or suchlike structure and in that the differences in electrical resistivity between both soft magnetic layers is at least a factor of 10, preferably at least a factor of 100. By the meandering, spiraling or suchlike structure, the electrical resistance of the second soft magnetic layer is increased, while the first soft magnetic layer has such a high electrical resistivity that short circuits of the meandering, spiraling or suchlike structure are prevented. The sensor according to the invention has an increased sensitivity with regard to and is more accurate than the known sensor. It is preferred that the first soft magnetic layer is of a ferrite material.

Although the second soft magnetic layer is preferably deposited on the first soft magnetic layer, it is possible to manufacture the bilayer with the second soft magnetic layer below or in, particularly recessed in, the second magnetic layer.

In many applications the ferrite material is used in the form of a polycrystalline thin film. It is known that the soft magnetic properties of bulk ferrite material are not preserved when this material is deposited in the form of a thin film. This is due to the reduced grain size of the thin film, compared to the bulk material, together with either a "hard"- or "non"-magnetic grain boundary. Hitherto, most studies focused attention on trying to increase the grain size of the film by either growing on a seeded substrate or post deposition annealing steps. Thin ferrites have been grown by MOCVD (modified chemical vapour deposition), pulsed laser ablation, MBE, Sol-gel and sputtering techniques. All of these methods have failed to produce a thin polycrystalline ferrite film with considerable magnetic properties.

The relative permeability of thin film ferrites is strongly dependent on the grain size of the film. This dependency may be described by either the non-magnetic grain boundary (NMGB) model (see: M. T. Johnson and E. G. Visser, IEEE Trans. Mag., Mag.-26, 1987 (1990)), which ascribes the increase in anisotropy to local demagnetizing fields, or the model of Pankert (see: J. Pankert, JMMM 138, 45 (1994), which attributes the low permeability to a lack of exchange coupling across the grains. For example, in a MnZn-ferrite film with a grain size of about 20 nm and a non-magnetic grain boundary of about 2 nm, the relative permeability is about 12 in both models. The relative permeability further increases with the grain size and diminishes with the non-magnetic grain boundary thickness.

It has already been discovered that a relatively hard thin ferrite film can be made considerably softer by depositing a closed thin film of soft magnetic material on top of the ferrite layer; see U.S. Pat. No. 4,610,935. Such an effect may be attributed to interactions between the soft magnetic layer and the individual grains of the ferrite film. Although the coupling between the two layers as indicated in said US patent specification is diminished by an open structure, such as a meandering, spiraling or suchlike structure, and therefore the magnetic properties of the bilayer structure are made worse, these properties, particularly with relatively small distances between the loops of the meandering, spiraling or suchlike structure, are still sufficient to realize a bilayer structure with such magnetoresistive properties that it can be successfully applied in a magnetoresistive magnetic field sensor according to the present invention.

In a particular embodiment a MnZn-ferrite layer is used, in combination with a permalloy or a CoNiFe soft magnetic layer. In a preferred embodiment the composition of the ferrite layer is given by $Mn_xZn_yFe_zO_w$, the atomic ratios preferably being x=0.48, y=0.31, z=1.79 and w=4.4, on which ferrite layer a $Ni_pFe_q$ layer is deposited with p=80 at. % and q=20 at. %.

In a preferred application, the bilayer structure according to the invention forms the layer in which the magnetization vector rotates under the influence of an external magnetic field in a magnetoresistive magnetic field sensor of an anisotropic type or a giant type.

The invention not only relates to a magnetoresistive magnetic field sensor as indicated above, but also to a magnetic read head device comprising such a magnetoresistive magnetic field sensor and to a system for recording information, comprising such a magnetic read head device.

In the following description, the general structure of a bilayer structure according to the invention and the application in a magnetoresistive magnetic field sensor will be elucidated, by way of example, with reference to the accompanying drawings.

DESCRIPTION OF THE PREFERRED EMBODIMENTS

Figure 1:
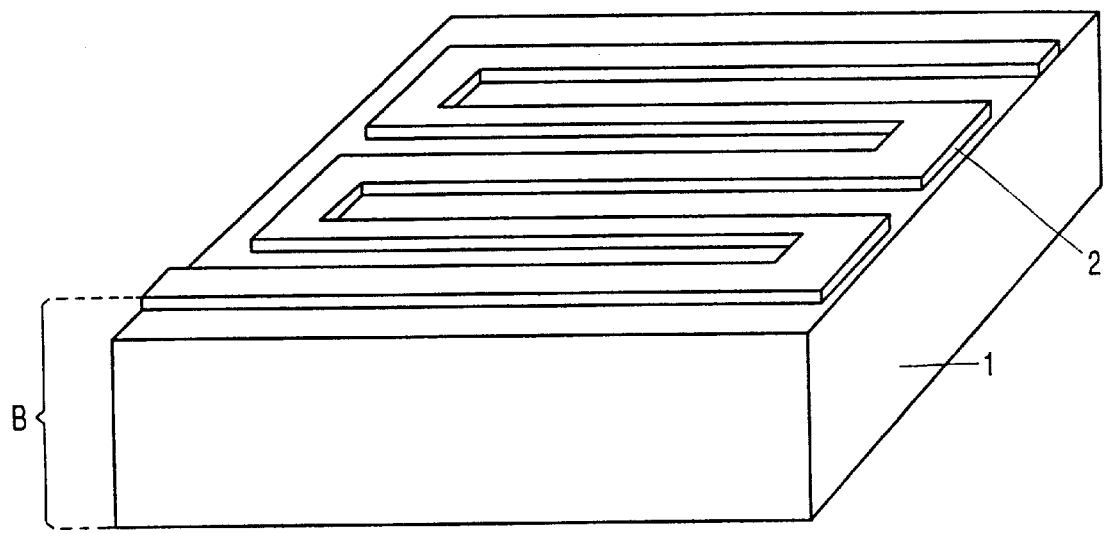
FIG. 1 shows the bilayer structure with a meander-like soft magnetic layer on a ferrite material.

FIG. 1 shows a perspective view of a bilayer B structure, which is part of a particular embodiment of a magnetoresistive magnetic field sensor according to the invention. The bilayer structure B comprises a first layer 1 of ferrite material and a second layer 2 of another soft magnetic material. The material of the second layer is magnetically softer and has a lower electrical resistivity than the ferrite layer 1. The second layer 2 is deposited on the ferrite layer, i.e. so as to form a stack of layers which are in direct contact with each other, such that the layers are exchange coupled, i.e. coupled by exchange forces. In the present embodiment the layer 2 is deposited on the ferrite layer in accordance with a meandering structure, which allows a high electrical resistance to be achieved in a relatively limited area. In this embodiment, the soft magnetic layer 2 consists of a permalloy layer $Ni_pFe_q$, where p=80 at. % and q=20 at. %, while a MnZnFeO-ferrite is chosen having a composition given by $Mn_xZn_yFe_zO_w$, with the following atomic ratios: x=0.48, y=0.31, z=1.79 and w=4.4.

Figure 2:
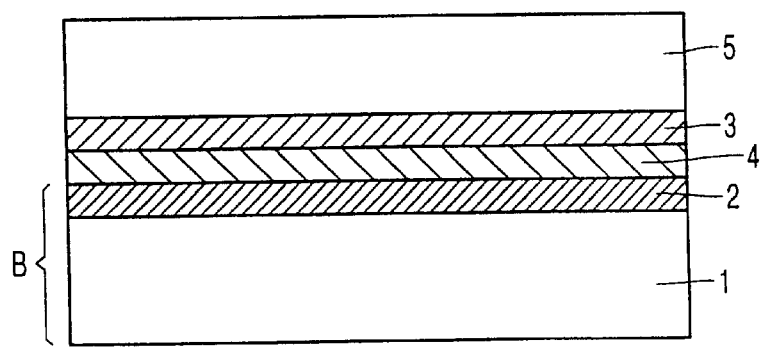
FIG. 2 shows the application of a bilayer structure according to the invention in a giant type magnetoresistive magnetic field sensor; while in FIG. 3 a yoke type magnetic read head is illustrated with an anisotropic magnetoresistive magnetic field sensor and a bilayer structure according to the invention.

FIG. 2 shows the layer structure of a giant-type magnetoresistive magnetic field sensor with the bilayer structure B according to the invention. The sensor comprises two soft magnetic layers B and 3, separated by a non-magnetic metal layer 4, in the present embodiment Cu, and an antiferromagnetic layer 5 for pinning the magnetization vector in the soft magnetic layer 3.

Figure 3:
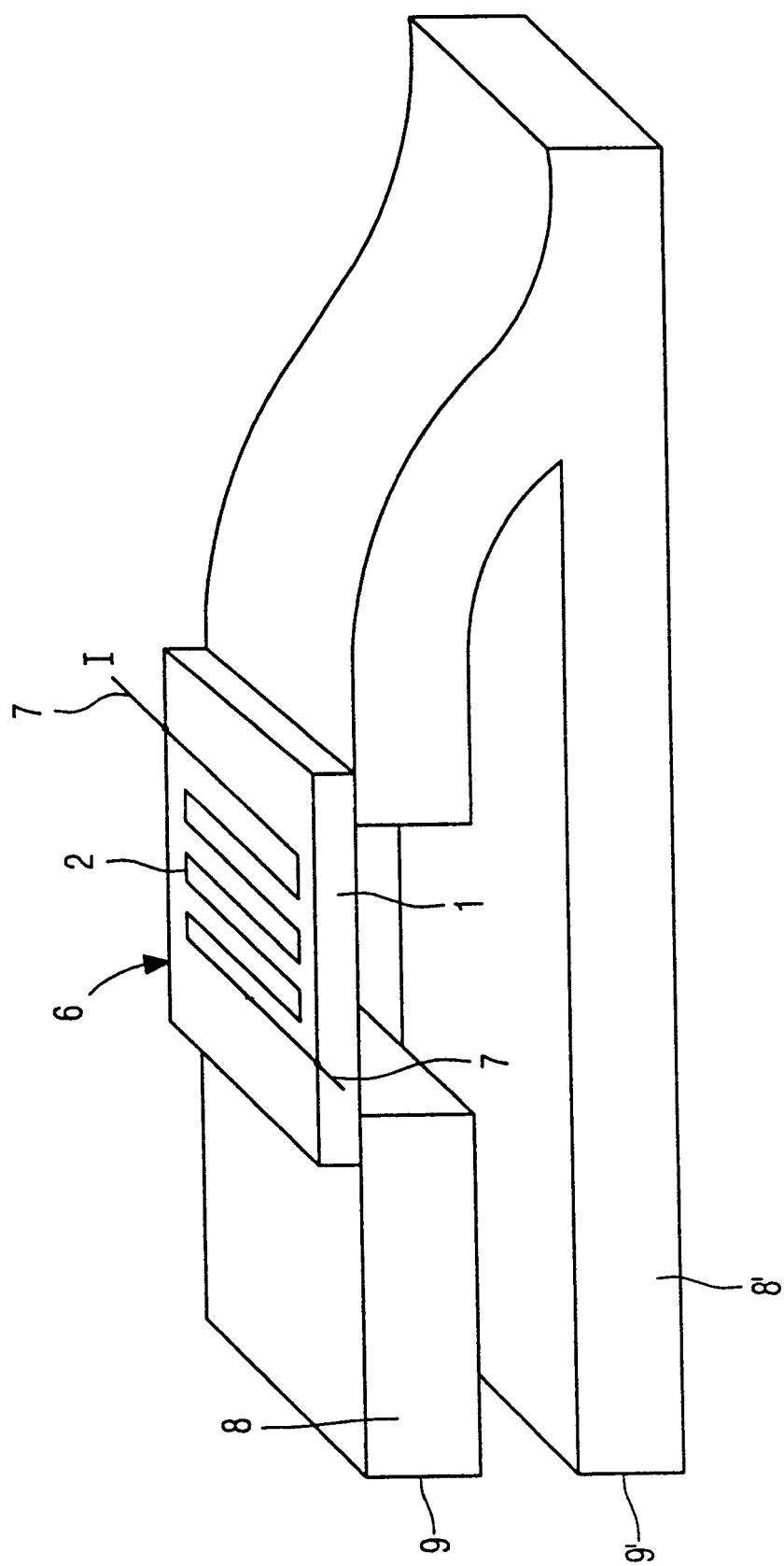

FIG. 3 schematically shows a perspective view of a magnetic read head device according to the invention, with an anisotropic magnetoresistive magnetic field sensor. The magnetoresistive element 6 consists of a bilayer structure of the type indicated in FIG. 1, i.e. a structure with a ferrite layer 1 and a meandering soft magnetic layer 2 with electrical connections 7 for the measuring current I. The magnetic read head additionally comprises magnetic flux guides 8, 8', which are positioned relative to the magnetoresistive element 6 so as to form a magnetic circuit. The end faces 9, 9' form part of the pole face of the head, the magnetic gap 10 being located between said faces 9, 9'. If a medium, such as a magnetic tape, disc or card, is fed past the faces 9, 9', in close proximity thereto, the magnetically stored information on that medium will generate a varying magnetic flux in the above-mentioned magnetic circuit, which magnetic flux is also fed through the magnetoresistive element 6. This magnetoresistive element 6 transcribes this varying magnetic flux into electrical resistance variations, which can be measured by voltage variations across the electrical connections 7.

The head may also contain an electrical coil, which can be employed in the recording of magnetic information on magnetic media.

What is claimed is:

1. Magnetorestrictive magnetic field sensor comprising a bilayer with a first soft magnetic layer and in direct contact therewith a second soft magnetic layer, said layers being exchange coupled to one another, the electrical resistivity of the first soft magnetic layer being higher than that of the second soft magnetic layer, characterized in that the second soft magnetic layer is located below, on or in the first soft magnetic layer in a meandering or spiraling structure, and in that the differences in electrical resistivity between both soft magnetic layers is at least a factor of 10.

2. Magnetoresistive magnetic field sensor according to claim 1, characterized in that the first soft magnetic layer is of ferrite material, and said differences in electrical resistivity between both soft magnetic layers is at least a factor of 100.

3. Magnetoresistive magnetic field sensor according to claim 2, characterized in that the ferrite layer is a thin film ferrite layer.

4. Magnetoresistive magnetic field sensor according to claim 1, characterized in that the first soft magnetic layer is a MnZn-ferrite layer and the second soft magnetic layer is permalloy or CoNiFe.

5. Magnetoresistive magnetic field sensor according to claim 4, characterized in that the composition of the ferrite layer is given by $Mn_xZn_yFe_zO_w$, the atomic ratios preferably being x=0.48, y=0.31, z=1.79 and w=4.4, and the composition of the permalloy layer is given by $Ni_pFe_q$, where preferably p=80 at. % and q=20 at. %.

6. Magnetoresistive magnetic field sensor according to claim 1, characterized in that the bilayer structure forms the layer in which the magnetization vector rotates under influence of an external magnetic field in a magnetoresistive magnetic field sensor of an anisotropic type or a giant type.

7. Magnetic read head device, comprising a magnetoresistive magnetic field sensor according to claim 1.

8. System for recording information, comprising a magnetic read head device according to claim 7.

9. Magnetoresistive magnetic field sensor according to claim 1, characterized in that said differences in electrical resistivity between both soft magnetic layers is at least a factor of 100.

* * * * *